United States Patent [19]

Shimizu et al.

[11] 4,405,656

[45] Sep. 20, 1983

[54] PROCESS FOR PRODUCING PHOTOCONDUCTIVE MEMBER

[75] Inventors: Isamu Shimizu, Yokohama; Kyosuke Ogawa; Eiichi Inoue, both of Tokyo, all of Japan

[73] Assignee: Canon Kabushiki Kaisha, Tokyo, Japan

[21] Appl. No.: 310,484

[22] Filed: Oct. 9, 1981

[30] Foreign Application Priority Data

Oct. 16, 1980 [JP] Japan .................................. 55-144797

[51] Int. Cl.³ ............................................. H01L 45/00
[52] U.S. Cl. .......................................... 427/39; 427/74
[58] Field of Search ...................................... 427/39, 74

[56] References Cited

U.S. PATENT DOCUMENTS

| | | | |
|---|---|---|---|
| 4,064,521 | 12/1977 | Carlson | 427/39 X |
| 4,196,438 | 4/1980 | Carlson | 427/39 X |
| 4,226,898 | 10/1980 | Ovshinsky et al. | 427/39 |
| 4,265,991 | 5/1981 | Hirai et al. | 430/64 |

*Primary Examiner*—James R. Hoffman
*Attorney, Agent, or Firm*—Fitzpatrick, Cella, Harper & Scinto

[57] ABSTRACT

A process for producing photoconductive members comprises evacuating a deposition chamber possible to evacuate, to a prescribed degree of vacuum; introducing silicon hydride compound gas, halogen-containing silicon compound gas, and diluent gas in a volume flow ratio of 4–30:2–60:36–81, respectively, into said deposition chamber; forming a gas plasmic atmosphere by generating glow discharge in said surrounding gas mixture; thereby forming, on the surface of a support, for producing the photoconductive member, which has been arranged previously in said deposition chamber, a photoconductive layer constructed of an amorphous material comprising silicon atoms as matrix.

13 Claims, 2 Drawing Figures

PROCESS FOR PRODUCING PHOTOCONDUCTIVE MEMBER

BACKGROUND OF THE INVENTION

1. Field of the Invention

The present invention relates to an effective process for producing photoconductive members which comprises forming a photoconductive layer on a given support by utilizing glow discharge, said photoconductive layer being constructed of amorphous material comprising silicon atoms as matrix.

2. Description of the Prior Art

When a gas for forming a photoconductive layer of amorphous material comprising silicon atoms as matrix is introduced into a deposition chamber, possible to evacuate, and a photoconductive layer having desired properties is formed on a given support by utilizing a plasmic phenomenon caused by glow discharge, in particular when the photoconductive layer needs to be of large area, it is very difficult as compared to the usual vacuum deposition process to increase the rate of forming the layer while keeping the entire area of the layer uniform in thickness, physical properties such as electrical, optical, and photoelectric characteristics, and layer qualities.

For instance, when a layer of amorphous silane (hereinafter referred to as a-Si:H) is formed on a support by decomposing gaseous $SiH_4$ using electric discharge energy and electrical properties of the layer are intended to utilize, lower rates of layer deposition and elevated temperatures of support are necessary in order to obtain uniform electrical properties and improved layer qualities throughout the entire area of layer because electrical properties of the layer depend largely upon the rate of layer deposition and the support temperature.

On the other hand, in order to increase the rate of layer deposition in view of improvements in the efficiency and scale of production, an approach is to increase the discharge power and the gas flow, but it has a marked tendency to deteriorate electrical, optical, and photoconductive characterisitcs of the produced layer and to increase the local dependency of these characteristics, so that it is extremely difficult to form a layer of good quality.

Such being the case, for the purpose of industrializing the production of photoconductive members having a layer of amorphous material comprising silicon atoms as matrix, it is necessary to improve the efficiency and scale of production including the reproducibility while keeping the layer qualities and uniformity thereof which are largely correlated with the photosensitivity and repeated service characteristics of the photoconductive members.

SUMMARY OF THE INVENTION

This invention has been accomplished in view of the above respects and its object is to provide a process for producing photoconductive members each having a photoconductive layer of amorphous material comprising silicon atoms as matrix, said process being excellent in the efficiency and scale of production and making it possible to obtain with ease the layer superior throughout its wide area in electrical, optical, and photoconductive characteristics and in layer qualities.

It is another object of the invention to provide a process for producing photoconductive members, wherein the layer, substantially uniform in physical properties and in thickness over the entire area even when the layer is very wide, can be formed in good reproducibility, high efficiency, and high rate of production.

A further object of the invention is to provide a process for producing photoconductive members, wherein a photoconductive layer of amorphous material comprising silicon atoms as matrix is formed on a support, previously arranged in a deposition chamber possible to evacuate, by evacuating said deposition chamber to a prescribed degree of vacuum, introducing therein a gaseous silane, gaseous halogen-containing silicon compound, and a gaseous diluent in a volume flow ratio 4–30:2–60:36–81, respectively, and generating therein glow discharge to form a gas plasmic atmosphere.

DESCRIPTION OF THE PREFERRED EMBODIMENTS

Figure 1:
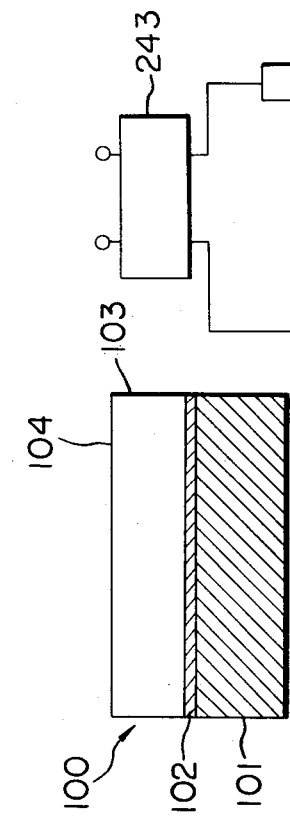
FIG. 1 is a schematic view for illustrating an example of construction of the photoconductive members produced in the process of this invention.

In this invention, the acceptable silane compounds and halogen-containing silicon compounds are those being in the gaseous state under ordinary temperature-pressure conditions or those at least readily gasifiable under conditions of forming the layer, because these compounds need to be in the gaseous state, for the simplicity of production process or the ease of raw material transfer when they are introduced into the deposition chamber for forming the photoconductive layer.

These silane and halogen-containing silicon compounds, in this invention, are used as starting materials for forming Si. The silane compounds effectively usable are gaseous or gasifiable silanes such as $SiH_4$, $Si_2H_6$, $Si_3H_8$, $Si_4H_{10}$, and the like, in particular, $SiH_4$ and $Si_2H_6$ are preferred in view of the ease of handling in the operations of layer formation and the high efficiency of Si formation. The preferred halogen-containing compounds are gaseous or gasifiable silicon halides such as $SiF_4$, $Si_2F_6$, $SiCl_4$, $SiBr_4$ and the like, and gaseous or gasifiable halogen substituted silicon hydride such as $SiH_2F_2$, $SiH_2Cl_2$, $SiHCl_3$, $SiH_2Br_2$, $SiHBr_3$ and the like. In particular, combinations of at least one of $SiH_4$ and $Si_2H_6$ and at least one of $SiF_4$ and $SiCl_4$ give especially good results.

The diluent gaseous materials acceptable in this invention are those having no adverse effect on the produced photoconductive layer and each being constituted of atoms which will become one of the constituents of said layer or those perfectly inert. Such gaseous materials preferred include rare gases such as He, Ne, and Ar; halogens such as fluorine, chlorine, bromine, and iodine; gaseous or gasifiable interhalogen compounds such as BrF, ClF, $ClF_3$, $BrF_5$, $BrF_3$, $IF_7$, $IF_5$, ICl, IBr and the like; hydrogen halides such as HF, HCl, HBr and the like, and hydrogen. Among them, rare gases and He are especially effective.

In the process of this invention, when photoconductive layers of the same characteristics and layer qualities as those obtained by the conventional processes are produced, the support temperature and the discharge power can be raised markedly as compared with those in the conventional processes. For example, a photoconductive layer having the characteristics and the layer qualities that fulfill the objects of this invention can be obtained at a support temperature of 300° C. or higher and with 100 W or more of discharge power.

The process for producing photoconductive members of this invention, having the features described above, permits the formation of a photoconductive layer, excellent in physical, optical, and photoelectric characteristics, additionally uniform in these characteristics and in thickness thoughout the whole area of itself, and having a large area.

The photoconductive members obtained by the production process of this invention are applied to electrophotography, taking advantage of their characteristics to the full extent.

This invention will be illustrated further by giving a preferred embodiment of the process for producing photoconductive members of the invention.

FIG. 1 is a schematic view of construction of a typical photoconductive member obtained according to the invention.

The photoconductive member 100 is that which can be applied to electrophotography or imaging devices and has a laminar structure built up of a support 101 suited for photoconductive members, an intermediate layer 102 laid thereupon as necessary, and a photoconductive layer 103 laid upon said intermediate layer 102.

The support 101 may be either electroconductive or electrically insulative. The conductive support includes, for example, metals such as NiCr, stainless steel, Al, Cr, Mo, Au, Ir, Nb, Ta, V, Ti, Pt, Pd and the like, and alloys thereof.

The nonconductive, i.e., electrically insulating supports generally used include film or sheet of synthetic resins such as polyester, polyethylene, polycarbonate, cellulose acetate, polypropylene, poly(vinyl chloride), poly(vinylidene chloride), polystyrene, polyamide and the like; glass; ceramic; and paper. Such an insulating support is preferred to have at least one conductivized surface, on which the other layers are successively laid.

This surface treatment for giving conductivity is carried out, for example, when the support is glass, by coating with a thin film of NiCr, Al, Cr, Mo, Au, Ir, Nb, Ta, V, Ti, Pt, Pd, $In_2O_3$, $SnO_2$, or ITO ($In_2O_3 + SnO_2$), and when the support is a film of synthetic resin such as polyester film, by vacuum deposition, electron beam vacuum deposition, sputtering, or laminating with a metal, to coat with a thin film of metal such as NiCr, Al, Ag, Pb, Zn, Ni, Au, Cr, Mo, Ir, Nb, Ta, V, Ti, Pt and the like. An optional shape of support may be such as cylindrical, belt-like, plate form and the like, and the shape is choosed in accordance with the purposes; for instance, when the photoconductive member, 100 in FIG. 1, is used as the electrophotographic imaging member in a high-speed continuous copying machine, its shape is desirable to be in a form of endless belt or cylinder.

The intermediate layer 102 is constructed of a nonphotoconductive amorphous material comprising as matrix, for example, silicon atoms and atoms of another kind, i.e., carbon atoms, nitrogen atoms, or oxygen atoms and if necessary, further containing hydrogen atoms or halogen atoms (X). This layer functions to inhibit the inflow of charge carriers from the support 101 into the photoconductive layer 103 effectively, and to facilitate the passage from the photoconductive layer 103 side to the support 101 side of photocarriers which have been produced in the photoconductive layer 103 by irradiation with electromagnetic radiation and move to the support 101.

In order to form the intermediate layer 102, glow discharge is adopted because it permits continuous operations from this formation to the photoconductive layer 103 formation, where raw material gas is introduced, if necessary, after mixed with a diluent gas such as He or Ar in a prescribed ratio, into the vacuum deposition chamber in which the support 101 has been set, and the introduced gas is then brought into a gaseous plasmic state by glow discharge to form an intermediate layer 102 on the support 101.

The starting materials effectively usable as the raw material gas for producing the intermediate layer 102 are silanes constituted of Si and H atoms, such as $SiH_4$, $Si_2H_6$, $Si_3H_8$, $Si_4H_{10}$ and the like; gaseous or gasifiable nitrogen, nitrides, and azides such as nitrogen ($N_2$), ammonia ($NH_3$), hydrazine ($H_2NNH_2$), hydrogen azide ($HN_3$), and ammonium azide ($NH_4N_3$); hydrocarbons, constituted of C and H atoms, including $C_1$–$C_5$ alkanes, $C_2$–$C_5$ alkenes, and $C_2$–$C_4$ alkynes, for example, as alkanes, methane ($CH_4$), ethane ($C_2H_6$), propane ($C_3H_8$), n-butane (n—$C_4H_{10}$), and pentane ($C_5H_{12}$); as alkenes, ethylene ($C_2H_4$), propylene ($C_3H_6$), butene-1 ($C_4H_8$), butene-2 ($C_4H_8$), isobutylene ($C_4H_8$), and pentene ($C_5H_{10}$); and as alkynes, acetylene ($C_2H_2$), methylacetylene ($C_3H_4$), and butyne ($C_4H_6$); and further, for example, oxygen ($O_2$), ozone ($O_3$), carbon monoxide (CO), carbon dioxide ($CO_2$), nitrogen monoxide (NO), nitrogen dioxide ($NO_2$), and dinitrogen oxide ($N_2O$).

These starting materials for producing the intermediate layer 102 are used after proper selection so that the layer 102 may contain prescribed atoms as constituents thereof.

The thickness of intermediate layer 102 is usually 30–1000 Å, preferably 50–600 Å.

The photoconductive layer 103 laid upon the intermediate layer 102 has the following semiconductor characteristics and is constructed of an amorphous material comprising silicon atoms as matrix and at least one kind of atoms, hydrogen atoms (H) and halogen atoms (X) [hereinafter said amorphous material is abbreviated as a-Si:(H,X)].

① p type of a-Si:(H,X) . . . containing only an acceptor or both a donor and an acceptor, the concentration of the latter (Na) being comparatively high.

② p⁻ type of a-Si:(H,X) . . . similar to the type ①, but the concentration of acceptor is comparatively low.

③ n type of a-Si:(H,X) . . . containing only a donor or both a donor and an acceptor, the concentration of the former (Nd) being comparatively high.

④ n⁻ type of a-Si:(H,X) . . . similar to the type ③, but the concentration of donor is comparatively low.

⑤ i type of a-Si:(H,X) . . . Na≃Nd≃0 or Na≃Nd.

The thickness of photoconductive layer 103 is determined properly so as to meet the purpose of using the photoconductive member in a reading machine, a solid imaging device, or as an electrophotographic imaging member.

The proper thickness of photoconductive layer 103 is determined in relation to the thickness of intermediate layer 102 so that the photoconductive layer 103 and the intermediate layer 102 each may function effectively, and is usually preferred to be hundreds-thousands times the thickness of intermediate layer 102, for example, usually 1–100μ, preferably 2–50μ.

The content of H, X, or (H+X) in the photoconductive layer 103 in the photoconductive member as shown in FIG. 1 is usually 1-40 atomic %, preferably 5-30 atomic %.

A n-type, p-type, and i-type of photoconductive layer 103 are produced by doping the layer to be formed, with impurities dominating conduction type, i.e. an n-type of impurity, a p-type of impurity, and both types of impurities, respectively, while controlling the amount of each impurity when the layer is formed.

The impurities of p-type which the photoconductive layer 103 can be doped with include the group III-A elements in the Periodic table, for example, B, Al, Ga, In, and Tl as suitable ones. Such impurities of n-type include the group V-A elements, for example, N, P, As, Sb, and Bi as suitable ones. In particular, B and Ga are best suited as the impurity of p-type, and P and Sb as the impurity of n-type.

The amount of impurity which the photoconductive layer 103 is doped with is properly determined in accordance with desired electrical and optical characteristics, and it is usually $10^{-6}$–$10^{-3}$ atomic ratio, preferably $10^{-5}$–$10^{-4}$ atomic ratio, in the case of an impurity of the group III-A in the Periodic table, and usually $10^{-8}$–$10^{-3}$ atomic ratio, preferably $10^{-8}$–$10^{-4}$ atomic ratio, in the case of an impurity of the group V-A in the Periodic table.

A starting material for introducing an impurity is charged into the deposition chamber along with the main starting material which forms the photoconductive layer 103, in order to dope the layer 103 with the impurity. The acceptable starting materials for introducing an impurity are those being in the gaseous state at ordinary temperature-pressure or being at least readily gasifiable under conditions of the layer formation. Such starting materials for introducing an impurity include, for example, $PH_3$, $P_2H_4$, $PF_3$, $PF_5$, $PCl_3$, $AsH_3$, $AsF_3$, $AsF_5$, $AsCl_3$, $SbH_3$, $SbF_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$ and the like.

EXAMPLE 1

Figure 2:
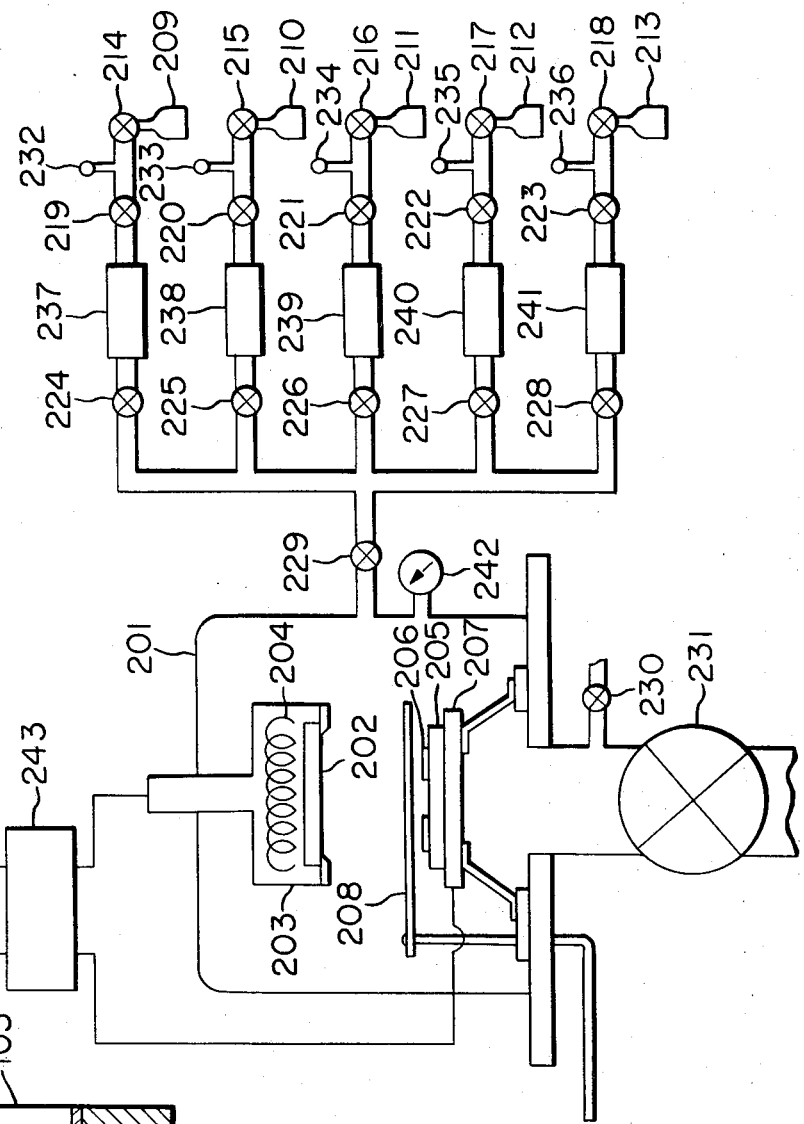
FIG. 2 is a schematic illustration of an apparatus for embodying the process of the invention.

Electrophotographic image forming members were prepared in the following way by using an apparatus, shown in FIG. 2, set up in a clean room perfectly shielded.

A molybdenum substrate 202 (10 cm×10 cm×0.5 mm) having surfaces cleaned was securely fastened to a fixing member 203 supported at a definite position in a deposition chamber 201.

A target made of a high purity graphite (99.999%) 205 and of a high purity polycrystalline silicon (99.999%) 206 laid thereon was fixed. The heater 204 in the fixing member 203 had been designed to heat the substrate 202 to a precision of ±0.5° C. A temperature (chromel-alumel couple) was arranged to measure directly the temperature of the substrate rear surface. After confirmation, that all the valves of the system were closed, the main valve 231 was fully opened and the deposition chamber 201 was evacuated once to about $5 \times 10^{-7}$ torr. An auxiliary valve 229 and outflow valves 224, 225, and 228 were opened, flow meters 237, 238, and 241 were thoroughly evacuated, and then the outflow valves 224, 225, and 228 and the auxiliary valve 229 were closed. The valve 218 of an argon gas (99.999%) bomb 213 was opened and adjusted so that the reading of the outlet pressure gauge 236 of the bomb 213 came to 1 Kg/cm². Then, an inflow valve 223 was opened and successively the outflow valve 228 and the auxiliary valve 229 were gradually opened to introduce argon gas into the chamber 201. After the flow of argon gas had been stabilized at an indication of $5 \times 10^{-4}$ torr of a Pirani gauge 242, the main valve 231 was gradually closed to restrict its opening until the inner pressure of the chamber 101 came to $1 \times 10^{-2}$ torr. A shutter 208 (this acts also as an electrode) was opened, and after stabilization of the argon flow had been confirmed by means the flow meter 241, a high-frequency power source 243 was switched on to apply 100 W of power a.c. 13.56 MHz between the target and the fixing member 203 (this acts also as an electrode). By keeping the matching to continue a stable discharge for 1 minute, an intermediate layer 100 Å thick was formed on the substrate 202.

The high-frequency power source 243 was turned off to intermit the discharge and successively the outflow valve 228 and the inflow valve 223 were closed and the main valve 231 was fully opened to withdraw the inner gas and evacuate the chamber 201 to $5 \times 10^{-7}$ torr. The input voltage to the heater 204 was raised and regulated while detecting the substrate temperature, to stabilize said temperature to a constant value of 400° C.

The auxiliary valve 229 and then the outflow valve 228 were fully opened to thoroughly evacuate the flow meter 241 also. After closing the auxiliary valve 229 and outflow valve 228, the valve 214 of a bomb 209 filled with $SiH_4$ gas containing 10 vol ppm of $B_2H_6$ (hereinafter shortened as $B_2H_6/SiH_4$; purity 99.999%) and the valve 215 of a bomb 210 filled with $SiF_4$ gas (99.999%) were opened, and the pressures of outlet pressure gauges 232 and 233 were adjusted to 1 Kg/cm². Inflow valves 219, 220, and 223 were gradually opened to introduce $B_2H_6/SiH_4$, $SiF_4$ gas, and Ar gas into flow meters 237, 238, and 241, respectively. Successively, the outflow valves 224, 225, and 228 and then the auxiliary valve 229 were gradually opened. At this time the inflow valves 219, 220, and 223 were controlled so as to give a flow ratio of $B_2H_6/SiH_4$ gas:$SiF_4$ gas:Ar gas=9:10:81. Then, the auxiliary valve 229 was opened while controlling its opening with watching the reading of Pirani gauge 242, until the inner pressure of the chamber 201 came to $1 \times 10^{-2}$ torr. After said pressure had been stabilized, the main valve 231 was gradually turned to restrict its opening until the indication of the Pirani gauge came to 0.2 torr. Stabilization of the gas inflow and of the inner pressure was confirmed, the shutter 208 was closed, and then the high-frequency power source was switched on to apply 100 W of power a.c. 13.56 MHz between the fixing member 203 and the shutter 208, thereby glow discharge being generated. A photoconductive layer was formed on the intermediate layer previously formed by continuing the glow discharge for 3 hours.

The heater 204 and the high-frequency power source 243 were switched off, and after the substrate temperature had come to 100° C., the outflow valves 224, 225, and 228 and inflow valves 219, 220, and 223 were closed and the main valve 231 was fully opened to evacuate the chamber 201 to $10^{-5}$ torr or below. Then, the main valve 231 was closed, a leak valve 230 was opened to return the chamber 201 to atmospheric pressure, and the resulting plate was taken out.

The total thickness of the produced layers was about 22μ. The image forming member thus obtained was set in a charging and exposing test machine, subjected to corona discharge at ⊕ 6.0 KV for 0.2 second, and immediately thereafter, the charged member was irradiated with a pattern of light in a quantity of 1.8 lux.sec. The light pattern had been prepared by passing the light from a tungsten lamp through a transmission type of test chart.

Immediately thereafter, by exposing the member face to a cascading developer (containing a toner and a carrier) of negative chargeability, a good toner image was formed on the member face. Transferring and fixing this toner image to a transfer paper by a corona charging at $\oplus$ 5.0 KV gave a clear image of high density, excellent in resolving power, having a good gradation reproducibility.

On the other hand, the same imaging member prepared as the above was subjected to corona discharge at $\ominus$ 5.5 KV for 0.2 second by using the charging and exposing test machine, immediately thereafter exposed to light in a quantity of 1.5 lux.sec. in the same way as the above, and immediately thereafter was exposed to a cascading developer of positive chargeability. Transferring and fixing thereof gave a very clear image.

From the former and latter results, the electrophotographic photoconductive member obtained in this example has proved not to depend upon the charging polarity, that is to say, it is provided with characteristics of double polar-working imaging member (usable in case of positive chargeability as well as negative chargeability).

EXAMPLE 2

After intermediate layers had been formed on molybdenum substrates by the same procedures under the same conditions as Example 1, photoconductive layers were formed on the intermediate layers using respectively the kinds of gas at the relative flow rates as shown in Table 1, by the same procedures under the same conditions as Example 1. As a result of forming toner images in the same manner as Example 1 using the image forming members thus obtained, samples A and C gave better toner images when corona charged at $\ominus$ 5.5 KV, exposed to light, and developed with a positively chargeable toner. On the contrary, sample B gave a better toner image when corona charged at $\oplus$ 6.0 KV, exposed to light, and developed with a negatively chargeable toner.

TABLE 1

| | Photoconductive layer | |
|---|---|---|
| Sample | Kinds of gas used in forming photoconductive layer (bomb number) | Relative flow rate |
| A | $SiF_4$ (210) | 10 |
| | $SiH_4$ (211) | 9 |
| | Ar (213) | 81 |
| B | $SiF_4$ (210) | 10 |
| | $SiH_4$ containing 100 vol ppm of $B_2H_6$ (211) | 9 |
| | Ar (213) | 81 |
| C | $SiF_4$ (210) | 10 |
| | $SiH_4$ containing 5 vol ppm of $PH_3$ (212) | 9 |
| | Ar (213) | 81 |

EXAMPLE 3

After intermediate layers had been formed on molybdenum substrates by the same procedures under the same conditions as in Example 1, photoconductive layers were formed on the intermediate layers using respectively the kinds of gas at the relative flow rates as shown in Table 2, by the same procedures under the same conditions as Example 1. It was found from studies of the image forming members thus obtained, from the two aspects, productivity (deposition rate) and characteristics (quality of image and operating characteristics in repeated copying), that a gas flow ratio of $SiH_4$ gas:$SiF_4$ gas:dilution gas=4–30:2–60:36–81 is necessary in order to form a photoconductive layer for achieving the objects of this invention.

TABLE 2

| | Gas used in photoconductive layer formation | | Rate of layer deposition (A/sec) | Image quality at exposure of up to 5 lux · sec | Operating characteristics in service repeated with 3 sec. period |
|---|---|---|---|---|---|
| Sample | Raw material gas (relative flow rate) | Dilution gas relative flow rate | | | |
| D | $SiH_4$ (1) $SiF_4$ (90) | Ar (9) | 3 | × | |
| E | $SiH_4$ (2) $SiF_4$ (80) | Ar (18) | 3 | × | |
| F | $SiH_4$ (4) $SiF_4$ (60) | Ar (36) | 6 | Δ | |
| G | $SiH_4$ (6) $SiF_4$ (40) | Ar (54) | 8 | | |
| H | $SiH_4$ (8) $SiF_4$ (20) | Ar (72) | 15 | | |
| I | $SiH_4$ (9) $SiF_4$ (10) | Ar (81) | 20 | | |
| J | $SiH_4$ (20) $SiF_4$ (5) | Ar (75) | 28 | | |
| K | $SiH_4$ (30) $SiF_4$ (2) | Ar (68) | 35 | Δ | Δ |
| L | $SiH_4$ (40) — | Ar (60) | 38 | Δ | × |
| M | $SiH_4$ (60) — | Ar (40) | 40 | × | × |
| N | $SiH_4$ (9) $SiF_4$ (10) | He (81)*1 | 18 | | |
| O | $SiH_4$ (9) | $H_2$ (81)*2 | 17 | | |

TABLE 2-continued

| Sample | Gas used in photoconductive layer formation | | Rate of layer deposition (A/sec) | Image quality at exposure of up to 5 lux · sec | Operating characteristics in survice repeated with 3 sec. period |
| --- | --- | --- | --- | --- | --- |
| | Raw material gas (relative flow rate) | Dilution gas relative flow rate) | | | |
| | SiF$_4$ (10) | | | | |

Designation:
 excellent,
 good,
Δ practically usable
× somewhat deficient in practicality
*[1] Ar Gas bomb 213 was changed to He gas bomb.
*[2] Ar gas bomb 213 was changed to H$_2$ gas bomb.

What we claim is:

1. A process for producing photoconductive members which comprises:
   (a) evacuating a pressure-reducible deposition chamber to reduce the pressure;
   (b) introducing silicon hydride compound gas, halogen-containing silicon compound gas, and diluent gas in a volume flow ratio of 4–30:2–60:36–81, respectively, into said deposition chamber;
   (c) forming a gas plasmic atmosphere by generating glow discharge in said surrounding gas mixture;
   (d) thereby forming, on the surface of a support, for producing the photoconductive member, which has been arranged previously in said deposition chamber, a photoconductive layer constructed of an amorphous material comprising silicon atoms as matrix.

2. A process for producing photoconductive members of claim 1, wherein said silicon hydride compound is a silane.

3. A process for producing photoconductive members of claim 2, wherein said silane is at least one member selected from the group consisting of monosilane, disilane, trisilane, and tetrasilane.

4. A process for producing photoconductive members of claim 1, wherein said halogen-containing silicon compound is a silicon halide.

5. A process for producing photoconductive members of claim 4, wherein said silicon halide is a silicon fluoride.

6. A process for producing photoconductive members of claim 1, wherein said diluent gas is a rare gas.

7. A process for producing photoconductive members of claim 6, wherein said rare gas is argon gas.

8. A process for producing photoconductive members of claim 1, wherein said diluent gas is hydrogen gas.

9. A process for producing the photoconductive members of claim 1, wherein a support is kept at 300° C. or higher during formation of the photoconductive members.

10. A process for producing the photoconductive members of claim 1, wherein a starting material for introducing an impurity is also introduced in the gaseous state into the deposition chamber in step (b).

11. A process for the producing photoconductive members of claim 10, wherein the starting material for introducing an impurity is at least one selected from the group consisting of PH$_3$, P$_2$H$_4$, PF$_3$, PF$_5$, PCl$_3$, AsH$_3$, AsF$_3$, AsF$_5$, AsCl$_3$, SbH$_3$, SbF$_3$, SbF$_5$, and BiH$_3$.

12. A process for producing the photoconductive members of claim 10, wherein the starting material for introducing an impurity is at least one selected from the group consisting of BF$_3$, BCl$_3$, BBr$_3$, B$_2$H$_6$, B$_4$H$_{10}$, B$_5$H$_9$, B$_5$H$_{11}$, B$_6$H$_{10}$, B$_6$H$_{12}$, and AlCl$_3$.

13. The process of claim 1 including conducting the steps of (i) introducing gaseous material containing sources of silicon and at least one member selected from the group consisting of carbon, nitrogen and oxygen into said chamber under reduced pressure and (ii) causing an electrical discharge in said gaseous material to form an intermediate layer on the substrate, between steps (a) and (b).

* * * * *

UNITED STATES PATENT AND TRADEMARK OFFICE
CERTIFICATE OF CORRECTION

PATENT NO. : 4,405,656

DATED : September 20, 1983

INVENTOR(S) : Shimizu, et al.

It is certified that error appears in the above-identified patent and that said Letters Patent is hereby corrected as shown below:

Col. 5, line 55, "temperature" should be --thermocouple--.

UNITED STATES PATENT AND TRADEMARK OFFICE
CERTIFICATE OF CORRECTION

PATENT NO. : 4,405,656

DATED : September 20, 1983

INVENTOR(S) : Shimizu, et al.

It is certified that error appears in the above-identified patent and that said Letters Patent is hereby corrected as shown below:

Cols. 8 and 9, Table 2,

" TABLE 2 " to

TABLE 2

| Sample | Gas used in photoconductive layer formation — Raw material gas (relative flow rate) | Dilution gas (relative flow rate) | Rate of layer deposition (Å/sec) | Image quality at exposure of up to 5 lux·sec | Operating characteristics in service repeated with 3 sec. period |
|---|---|---|---|---|---|
| D | $SiH_4$ (1) / $SiF_4$ (90) | Ar (9) | 3 | x | ⊙ |
| E | $SiH_4$ (2) / $SiF_4$ (80) | Ar (18) | 3 | x | ⊙ |
| F | $SiH_4$ (4) / $SiF_4$ (60) | Ar (36) | 6 | △ | ⊙ |
| G | $SiH_4$ (6) / $SiF_4$ (40) | Ar (54) | 8 | ○ | ⊙ |
| H | $SiH_4$ (8) / $SiF_4$ (20) | Ar (72) | 15 | ⊙ | ⊙ |
| I | $SiH_4$ (9) / $SiF_4$ (10) | Ar (81) | 20 | ⊙ | ⊙ |
| J | $SiH_4$ (20) / $SiF_4$ (5) | Ar (75) | 28 | ○ | ○ |
| K | $SiH_4$ (30) / $SiF_4$ (2) | Ar (68) | 35 | △ | △ |
| L | $SiH_4$ (40) / — | Ar (60) | 38 | △ | x |
| M | $SiH_4$ (60) / — | Ar (40) | 40 | x | x |
| N | $SiH_4$ (9) / $SiF_4$ (10) | He (81)*1 | 18 | ⊙ | ⊙ |
| O | $SiH_4$ (9) / $SiF_4$ (10) | $H_2$ (81)*2 | 17 | ⊙ | ⊙ |

Designation: ⊙ excellent, ○ good, △ practically usable, x somewhat deficient in practicality

*1: Ar gas bomb 213 was changed to He gas bomb.
*2: Ar gas bomb 213 was changed to $H_2$ gas bomb.

Signed and Sealed this

Sixth Day of March 1984

[SEAL]

Attest:

GERALD J. MOSSINGHOFF

Attesting Officer

Commissioner of Patents and Trademarks